(12) United States Patent
Teboulle et al.

(10) Patent No.: US 11,658,871 B2
(45) Date of Patent: May 23, 2023

(54) TRANSMISSION OF DATA FROM A MANAGEMENT ENTITY TO A SMART ELECTRICITY METER

(71) Applicant: SAGEMCOM ENERGY & TELECOM SAS, Rueil Malmaison (FR)

(72) Inventors: Henri Teboulle, Rueil Malmaison (FR); Jean-Paul Lecappon, Rueil Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 0 days.

(21) Appl. No.: 16/980,185

(22) PCT Filed: Mar. 26, 2019

(86) PCT No.: PCT/EP2019/057633
§ 371 (c)(1),
(2) Date: Sep. 11, 2020

(87) PCT Pub. No.: WO2019/185655
PCT Pub. Date: Oct. 3, 2019

(65) Prior Publication Data
US 2021/0014111 A1   Jan. 14, 2021

(30) Foreign Application Priority Data
Mar. 27, 2018   (FR) ........................................ 1852648

(51) Int. Cl.
*H04L 41/082*   (2022.01)
*G01R 22/06*   (2006.01)
(Continued)

(52) U.S. Cl.
CPC .......... *H04L 41/082* (2013.01); *G01R 22/063* (2013.01); *H04B 3/544* (2013.01);
(Continued)

(58) Field of Classification Search
CPC ....... H04L 41/082; H04L 67/12; H04L 67/34; H04L 67/06; G01R 22/063; H04B 3/544;
(Continued)

(56) References Cited

U.S. PATENT DOCUMENTS

| 10,805,200 B2 * | 10/2020 | Erickson | .............. H04W 40/246 |
| 2012/0173873 A1 * | 7/2012 | Bell | ....................... H04L 9/3263 |
| | | | 713/168 |

(Continued)

FOREIGN PATENT DOCUMENTS

| CN | 206301319 U | * | 7/2017 | |
| EP | 3122061 A1 | * | 1/2017 | ............. G01D 4/004 |
| EP | 3122061 A1 | | 1/2017 | |

OTHER PUBLICATIONS

Armstrong et al. "Efficient and Transparent Dynamic Content Updates for Mobile Clients" pp. 56-69 (Year: 2006).*
(Continued)

*Primary Examiner* — Eyob Hagos
(74) *Attorney, Agent, or Firm* — Oliff PLC (57) ABSTRACT

A method for transmitting data from a management entity in a communication system further comprising at least one data concentrator device to which smart electricity meters are attached via a first powerline communication network, each data concentrator device being connected to the management entity via a second communication network. Said smart electricity meter receives, coming from the management entity, via the first powerline communication network, a message indicating that a transfer of data is pending with the management entity. Said smart electricity meter com-
(Continued)

prising a wireless communication interface adapted to communicate via a third wireless local communication network with a residential gateway connected to the management entity via a fourth communication network, said smart electricity meter obtains said data from the management entity via the third wireless local communication network.

9 Claims, 4 Drawing Sheets

(51) Int. Cl.
    *H04B 3/54*     (2006.01)
    *H04L 67/12*     (2022.01)
    *H04Q 9/00*     (2006.01)

(52) U.S. Cl.
    CPC ............... *H04L 67/12* (2013.01); *H04Q 9/00* (2013.01); *H04Q 2209/40* (2013.01); *H04Q 2209/60* (2013.01); *H04Q 2213/05* (2013.01)

(58) Field of Classification Search
    CPC ........ H04B 3/54; H04Q 9/00; H04Q 2209/40; H04Q 2209/60; H04Q 2213/05; Y04S 40/18; H04W 4/70
    See application file for complete search history.

(56) References Cited

U.S. PATENT DOCUMENTS

| | | | |
|---|---|---|---|
| 2014/0376405 A1* | 12/2014 | Erickson | H04W 40/246 370/254 |
| 2016/0028438 A1* | 1/2016 | Sun | H04B 3/30 375/219 |
| 2016/0118793 A1 | 4/2016 | Davis et al. | |
| 2016/0306620 A1* | 10/2016 | Mille | G01D 4/004 |
| 2018/0077592 A1* | 3/2018 | Kim | H04L 65/80 |
| 2019/0191387 A1* | 6/2019 | Shakya | H04W 52/241 |
| 2020/0186194 A1* | 6/2020 | Gilbert | H04B 3/542 |
| 2021/0091822 A1* | 3/2021 | Alpert | H04B 3/546 |

OTHER PUBLICATIONS

Jin et al. "Smart Home Networking: Lessons from Combining Wireless and Powerline Networking", pp. 137-147 (Year: 2011).*

May 31, 2019 International Search Report issued in International Patent Application No. PCT/EP2019/057633.

Armstrong et al; "Efficient and Transparent Dynamic Content Updates for Mobile Clients;" pp. 56-68; Jun. 19, 2006.

* cited by examiner

TRANSMISSION OF DATA FROM A MANAGEMENT ENTITY TO A SMART ELECTRICITY METER

The present invention relates to a transmission of data to smart electricity meters from a management entity of a communication system to which said electricity meters belong.

Powerline communication networks for AMM (automated meter management) systems have made their appearance during the past years. Mention can be made for example of the PRIME (PoweRline Intelligent Metering Evolution) specifications and the G3-PLC standard specified in the ITU-T recommendation G.9903. In such powerline communication networks, communications are established between so-called smart electricity meters and a data concentrator device, sometimes referred to as a base node or coordinator, to enable in particular an automated remote reading of electricity consumption measurements made by said smart electricity meters. A plurality of such data concentrator devices are typically geographically deployed so as to distribute the remote management load of a multitude of smart electricity meters, each data concentrator then being connected to the same management entity of the AMM system that is managed by the operator of the electricity supply network to which said smart electricity meters are connected.

Such powerline communications must deal with interferences related to crosstalk phenomena, and/or to a lack of reliability of some communication links in the powerline communication network (e.g. limit of range due to the length of the cables), and/or to noises of various natures (white noise, coloured noise, impulse noise mainly), and/or to impedance mismatching. For the record, crosstalk is a phenomenon that enables signals, typically by capacitive coupling, to propagate without passing through copper pairs proper, but through invisible parasitic links. This phenomenon is unstable since it may vary according to the temperature or the activity on the powerline communication network. It should be noted that there may also be crosstalk within the same apparatus via copper connections on printed circuits and/or via certain components that constitute said apparatus. These phenomena may give rise to losses of packets or messages, in particular signaling packets or messages, and cause disconnections of node devices in the communication network. Such instability of powerline communication networks makes problematic the transmission of data to the smart electricity meters from the management entity of the AMM system, in particular in terms of latency since, for example, reconfigurations of the communication network following disconnections of smart electricity meters, some of which serve as relays between a data concentrator device and other smart electricity meters, are lengthy and tedious.

It is desirable to overcome these drawbacks of the prior art, and in particular to improve the capacities for transmission of data to the smart electricity meters from the management entity of the AMM system, in particular in the context of software updating of the smart electricity meters and/or of updating of user profiles associated with users of these smart electricity meters.

The invention relates to a method for transmitting data from a management entity in a communication system further comprising at least one data concentrator device to which smart electricity meters are attached via a first powerline communication network, each data concentrator device being connected to the management entity via a second communication network. The method being such that, in order to transmit data from the management entity to a said smart electricity meter, said smart electricity meter receives, coming from the management entity, via the first powerline communication network, a message indicating that a data transfer is pending with the management entity. In addition, said smart electricity meter comprising a wireless communication interface adapted to communicate via a third wireless local communication network with a residential gateway connected to the management entity via a fourth communication network, said smart electricity meter obtains said data from the management entity via the third wireless local communication network. Thus, by virtue of the third wireless local communication network and the residential gateway, the transfer of the data from the management entity to said smart electricity meter is more efficient, avoiding having recourse to the first powerline communication network for the transfer of said data.

According to a particular embodiment, on reception of the message indicating that the data transfer is pending with the management entity, said smart electricity meter performs the following steps: determining whether said smart electricity meter has a connection, via said third wireless local communication network, with said residential gateway enabling it to communicate with the management entity by means thereof; obtaining said data from the management entity via the third wireless local communication network when said smart electricity meter has a connection, via said third wireless local communication network, with said residential gateway; and obtaining said data from the management entity via the first powerline communication network when said smart electricity meter does not have a connection, via said third wireless local communication network, with said residential gateway.

According to a particular embodiment, said smart electricity meter also checks whether or not the quantity of data to be transferred from the management entity is higher than a first predefined threshold beyond which the transmission of this quantity of data by the powerline communication network has a probability higher than a second predefined threshold of undergoing a reconfiguration of the powerline communication network. Then said smart electricity meter obtains said data from the management entity via the third wireless local communication network when said smart electricity meter has a connection, via said wireless local communication network, with said residential gateway and furthermore when the quantity of data to be transferred is higher than said first predefined threshold.

According to one embodiment, said smart electricity meter also checks whether or not the quantity of data to be transferred from the management entity is below a value, referred to as the limit value, obtained from a predefined curve connecting quantities of data to be downloaded to values representing probabilities of success of a downloading performed via the powerline communication network and representing a probability of success supplied by the management entity representing a probability that the powerline communication network does not undergo a reconfiguration at the moment when the smart electricity meter will begin said downloading, said smart electricity meter obtaining said data from the management entity via the powerline communication network when the quantity of data to be transferred is below the limit value.

According to a particular embodiment, said smart electricity meter exports, via the wireless communication interface thereof, an entry web page for making it possible to enter a network name and a password, and said smart electricity meter connects to said residential gateway by means of the network name and the password entered via said entry web page.

According to a particular embodiment, said smart electricity meter exports the entry web page only when said smart electricity meter does not have a network name and a password making it possible to use its wireless communication interface to communicate with the management entity.

According to a particular embodiment, after having obtained said data from the management entity via the third wireless local communication network, said smart electricity meter makes, with the management entity, exchanges confirming successful transfer, said exchanges taking place via the first powerline communication network.

According to a particular embodiment, the wireless communication interface is of the Wi-Fi type.

The invention also relates to a smart electricity meter configured to receive data from a management entity in a communication system further comprising at least one data concentrator device to which at least said smart electricity meter is attached via a first powerline communication network, each data concentrator device being connected to the management entity via a second communication network. To transmit data from the management entity to said smart electricity meter, said smart electricity meter comprises means for receiving, coming from the management entity via the first powerline communication network, a message indicating that a data transfer is pending with the management entity. In addition, said smart electricity meter comprises a wireless communication interface adapted to communicate, via a third wireless local communication network, with a residential gateway connected to the management entity via a fourth communication network, and means for obtaining said data from the management entity via the third wireless local communication network.

The invention also relates to a computer program that can be stored on a medium and/or downloaded from a communication network, in order to be read by a processor. This computer program comprises instructions for implementing the method mentioned above, when said programme is executed by the processor. The invention also relates to storage means comprising such a computer program.

The features of the invention mentioned above, as well as others, will emerge more clearly from a reading of the following description of an example embodiment, said description being made in relation to the accompanying drawings, among which.

Figure 1A:
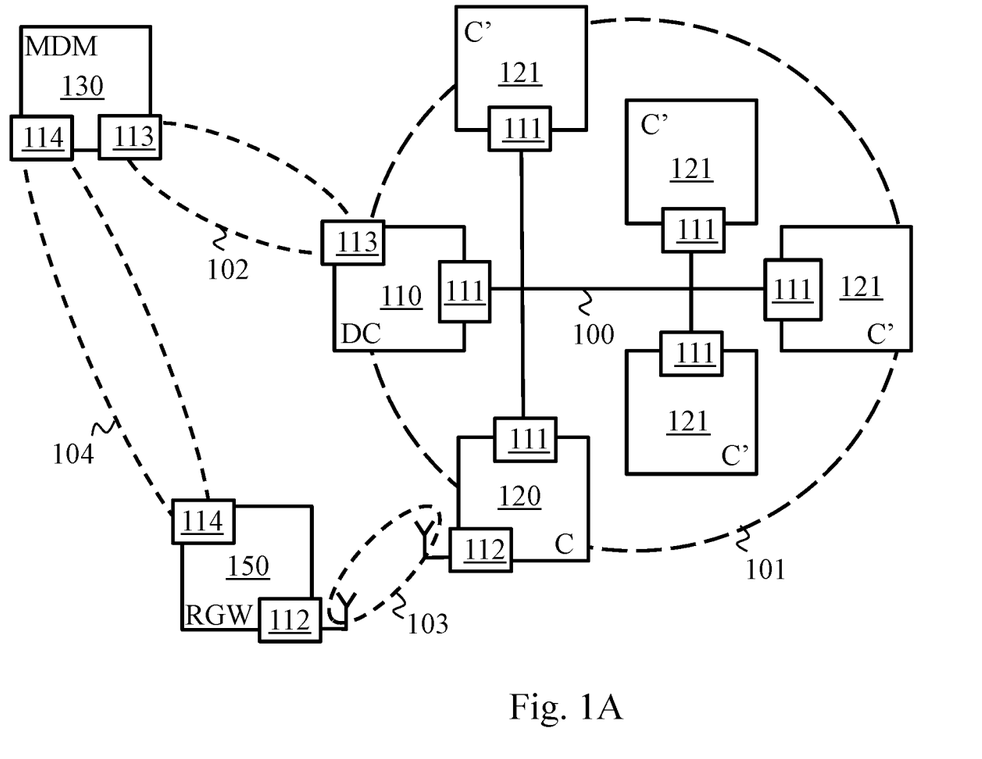
FIG. 1A illustrates schematically a communication system in the context of a remote automated management of smart electricity meters, in one embodiment of the invention.

The communication system of FIG. 1A, of the AMM type, comprises an MDM (meter data management) entity 130 for management of said system and a plurality of smart electricity meters C 120, C' 121.

The management entity MDM 130 is in particular responsible for collecting information transmitted by the smart electricity meters C 120, C' 121, such as readings of electricity consumption of electricity installations that said smart electricity meters C 120, C' 121 are responsible for monitoring, and for transmitting data, such as software updates and/or user profiles, to said smart electricity meters C 120, C' 121.

To make it possible to exchange data between the smart electricity meters C 120, C' 121 and the management entity MDM 130, powerline communications are established between each of said smart electricity meters C 120, C' 121 and a data concentrator device DC 110. The communication system typically comprises a plurality of data concentrator devices DC 110, only one being shown in FIG. 1A. A plurality of smart electricity meters C 120, C' 121 are connected, in logic fashion, to each data concentrator device DC 110, each data concentrator device DC 110 thus serving as a relay between said smart electricity meters C 120, C' 121 that are connected thereto and the management entity MDM 130. A powerline communication network 101 is thus formed between each data concentrator device DC 110 and the plurality of smart electricity meters C 120, C' 121 that are connected thereto, relying on an electricity supply network 100 serving to supply with electricity the electrical installations that said smart electricity meters C 120, C' 121 are responsible for monitoring.

Each smart electricity meter C 120, C' 121 thus comprises a powerline communication interface 111 for communicating via the powerline communication network 101. Likewise, each data concentrator device DC 110 comprises such a powerline communication interface 111 for communicating via the powerline communication network 101. According to one example embodiment, the powerline communication network 101 is in accordance with the PRIME specifications. According to another example embodiment, the powerline communication network 101 is in accordance with the G3-PLC standard.

It must be understood that the topology of the powerline communication network 101 is not fixed. Because in particular of the phenomena of crosstalk and other interferences, smart electricity meters C 120, C' 121 may be disconnected from the powerline communication network 101 and then seek to re-register in the powerline communication network 101. The topology of the powerline communication network 101 at that moment is then probably different from the topology of the powerline communication network 101 before disconnection of said smart electricity meters 120.

To make it possible to relay the information exchanged between the smart electricity meters C 120, C' 121 intended for the management entity MDM 130, each data concentrator device DC 110 further comprises an interface 113 for communication with the communication network 102, to which the management entity MDM 130 is also connected.

Since the data concentrator devices DC 110 may typically be installed in transformer stations of the electricity supply network 100, the communication network 102 is preferentially a wireless telecommunication network. According to one embodiment, the communication network 102 is in accordance with the UMTS (Universal Mobile Telecommunications System) standard. According to another example embodiment, the communication network 102 is in accordance with the LTE (Long Term Evolution) standard.

The management entity MDM 130 also comprises a communication interface 113 with the communication network 102 enabling it to communicate with a plurality of data concentrator devices DC 110. The communications between the management entity MDM 130 and each data concentrator device DC 110 may take place via one or more intermediate servers, as illustrated in FIG. 1B.

Figure 1B:
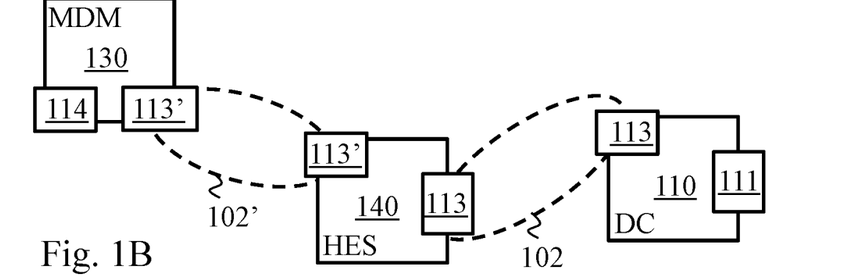
FIG. 1B illustrates schematically a variant arrangement of a part of the communication system for FIG. 1A.

In FIG. 1B, the management entity MDM 130 is connected to each data concentrator device DC 110 via a head-end system HES 140 to which the management entity MDM 130 can delegate processing operations. The management entity MDM 130 then comprises a communication interface 113' with a communication network 102' enabling it to communicate with the head-end system HES 140. Likewise, the head-end system HES 140 comprises a communication interface 113' with a communication network 102' enabling it to communicate with the management entity MDM 130. In addition, the head-end system HES 140 comprises a communication interface 113 with a communication network 102 enabling it to communicate with one or more data concentrator devices DC 110. The communication network 102' is for example of the IP type, such as the internet.

The management entity MDM 130 is preferentially in accordance with the set of standards IEC 62056, i.e. the DLMS (Device Language Message Specification) and COSEM (Companion Specification for Energy Metering) specifications.

The management entity MDM 130 further comprises a communication interface 114 with a communication network 104 of the IP type, such as the internet, to enable it in particular to communicate with residential gateways RGW 150. Such residential gateways RGW 150 are typically provided by operators providing access to the internet and installed in private houses or in business premises. In other words, a user who has a smart electricity meter C 120 for managing the electricity supply to his dwelling or to his premises also often has a residential gateway RGW 150 for accessing the internet from this dwelling or these premises.

The residential gateways RGW 150 also comprise a communication interface 114 with the communication network 104 of the IP type in order in particular to enable them to communicate with the management entity MDM 130. Each residential gateway RGW 150 further comprises a communication interface 112 with a communication network 103 of the WLAN (wireless local area network) type that said residential gateway RGW 150 creates and manages. The communication network 103 is preferentially of the Wi-Fi type, as defined in the family of standards IEEE 802.11.

The smart electricity meters C 120 differ from the smart electricity meters C' 121 in that the smart electricity meters C 120 also comprise a communication interface 112 with a communication network of the WLAN type. The smart electricity meters C 120 are thus able to communicate with the management entity MDM 130 by relying on a said communication network 103 to use a said residential gateway RGW 150 as a relay with the management entity MEM 130. It should be noted that the communication system of FIG. 1A may contain only smart electricity meters C 120, that is to say having the communication interface 112.

Such an arrangement of the communication system then offers two alternatives for enabling the smart electricity meters C 120 to receive data from the management entity MDM 130. The communication networks 103 and 104 being more stable and being able to offer a higher bit rate than the powerline communication network 101, the smart electricity meters C 120 favour their communication interface 112 for receiving bulky data coming from the management entity MDM 130. "Bulky data" means a quantity of data higher than a first predefined threshold TH1 (for example 200 kilobytes) beyond which the transmission of this quantity of data by the powerline communication network 101 has a probability higher than a second threshold TH2 determined dynamically by the MDM 130 of undergoing a reconfiguration of the powerline communication network 101. For example, the transfer of a software update for the smart electricity meters C 120 is typically considered to be a transfer of bulky data.

However, powerline communications are guaranteed whereas communications via Wi-Fi are not.

In one embodiment, the management entity MDM 130 regularly collects, at each smart electricity meter C 120, firstly a routing table (which indicates communication routes used by said meter), and secondly a table of neighbours (which indicates other elements of the network with which said meter has exchanged data). From these tables, the management entity MDM 130 determines, for a set of given smart electricity meters C 120 (for example those dependent on a given data concentrator device DC 110), a probability density that the powerline communication network 101 connecting the smart electricity meters C 120 of said set to their data concentrator device DC 110 will reconfigure. For this purpose it measures periods between two configurations and deduces therefrom a Gaussian curve representing said probability density. Thus, when a configuration of the powerline communication network 101 occurs at an instant T0, the management entity MDM 130 initiates a time measurement as from T0. Each instant T following the instant T0 is associated with a probability P of failure of a data transmission via the powerline communication network 101 connecting the smart electricity meters C 120 of said set to their data concentrator device DC 110. The probability of failure P is an area of the probability density between T0 and T.

R is a probability of success associated with $P \cdot R = 1 - P$.

Thus, when a smart electricity meter C 120 of said set must download data coming from the management entity MDM 130, it receives from the management entity MDM 130 a probability of success R concerning said set. This probability of success corresponds to the moment when the smart electricity meter will begin the downloading, that is to say it represents the probability that the powerline communication network 101 connecting the smart electricity meter C 120 to its data concentrator device 110 will not undergo a reconfiguration during the downloading of said meter as from the moment when the smart electricity meter C 120 will begin its downloading. It also knows what is the quantity of data to be downloaded Q.

The smart electricity meter C 120 has internally a predefined decision curve enabling it to choose whether or not it can use the powerline communication network 101 for downloading the data. The X axis of the predefined decision curve is the values representing probabilities R of success of a downloading made on the powerline communication network 101 related to a reconfiguration of the network, and the Y axis values representing quantities of data to be downloaded. This curve intersects the X axis at the probability value 1 (i.e. corresponding to 100% chance of downloading all the data of size 0 bytes by the powerline communication network 101), and the Y axis at a value Y0. In one embodiment, Y0 is fixed at 800 kilobytes, that is to say as from 800 kilobytes it is considered that the probability of success of a downloading via the powerline communication network 101 is zero. In one embodiment, the value Y0 is determined by the management entity MDM 130 and supplied to each smart electricity meter C 120. In one embodiment, the predefined curve is a straight line of equation $y=-Y0(r)+Y0$, where $r(=1-p)$ is a probability value between zero and unity.

The smart electricity meter C 120 takes the decision to perform a downloading via the powerline communication network 101 if, for the probability of success R supplied by the management entity MEM 130, the quantity of data to be downloaded Q is less than $y_R=Y0(R)+Y0$. Otherwise the smart electricity meter C 120 takes the decision to perform a downloading via the communication networks 103 and 104. It is supposed here that the smart electricity meter C 120 takes the decision as soon as the probability R is received, so that the probability R supplied by the management entity MDM 130 is valid for said downloading.

It should be noted that the communications between the smart electricity meters C 120, C' 121 and the management entity MDM 130 preferentially take place encrypted, whatever the data path used, for example by establishing virtual private networks VPN.

Figure 2:
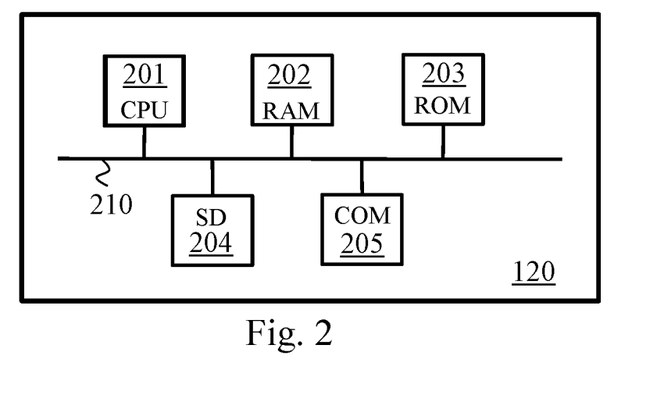
FIG. 2 illustrates schematically an example of hardware architecture for control of a smart electricity meter of the communication system of FIG. 1A.

FIG. 2 illustrates schematically an example of hardware architecture for monitoring the smart electricity meter C 120.

The smart electricity meter C 120 in question then comprises, connected by a communication bus 210: a processor or CPU (central processing unit) 201; a random access memory RAM 202; a read only memory ROM 203; a storage unit 204, such as a hard disk HDD (hard disk drive), or a storage medium reader, such as an SD (Secure Digital) card reader; a set of interfaces COM 205 enabling the communication device to communicate in the communication system of FIG. 1A.

The processor 201 is capable of executing instructions loaded in the RAM memory 202 from the ROM memory 203, from an external memory (not shown), from a storage medium (such as an SD card), or from a communication network. When the smart electricity meter C 120 in question is powered up, the processor 201 is capable of reading instructions from the RAM 202 and executing them. These instructions form a computer program causing an implementation, by the processor 201, of all or some of the algorithms and steps described below.

All or some of the algorithms and steps described below can be implemented in software form by the execution of a set of instructions by a programmable machine, for example a DSP (digital signal processor) or a microcontroller, or be implemented in hardware form by a machine or a dedicated component, for example an FPGA (field-programmable gate array) or an ASIC (application-specific integrated circuit).

In general terms, each smart electricity meter C 120 thus comprises electronic circuitry configured to implement all or some of the algorithms and steps described below.

Figure 3:
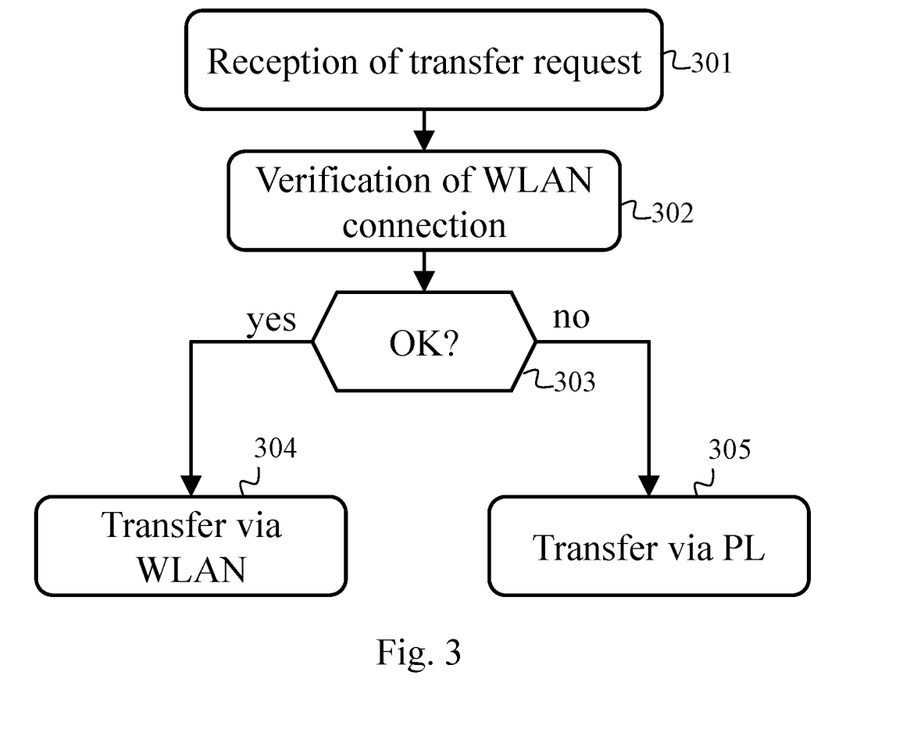
FIG. 3 illustrates schematically an algorithm, executed by at least one smart electricity meter of the system of FIG. 1A, for receiving data from a management entity of the system of FIG. 1A.

FIG. 3 illustrates schematically an algorithm, executed by each smart electricity meter C 120, for receiving data from the management entity MDM 130.

In a step 301, said smart electricity meter C 120 receives, via the communication interface 111 with the powerline communication network 101, a transfer request coming from the management entity MDM 130. In other words, the management entity MDM 130 indicates that a data transfer, for the attention of said smart electricity meter C 120, is pending with the management entity MDM 130. Preferentially, the transfer request indicates what quantity of data are to be transferred from the management entity MDM 130. For example, such a transfer request is a software update intended for said smart electricity meter C 120 or a user profile update associated with a user of said smart electricity meter C 120.

In a step 302, said smart electricity meter C 120 determines whether said smart electricity meter C 120 has a connection, via a said communication network 103, with a residential gateway RGW 150 enabling it to communicate with the management entity MDM 130 by means thereof. This aspect is detailed below in relation to FIG. 5.

In a step 303, said smart electricity meter C 120 checks whether or not said smart electricity meter C 120 has said connection. If such is the case, a step 304 is performed; otherwise a step 305 is performed.

In the step 304, said smart electricity meter C 120 organises the transfer via the WLAN communication network 103, that is to say relying on the residential gateway RGW 150 which is the access point AP of said communication network 103. This aspect is detailed below in relation to FIG. 4.

In the step 305, said smart electricity meter C 120 organises the transfer via the powerline communication network 101, as normally takes place in the context of AMM systems.

In a particular embodiment, in order to decide which means to use for performing the transfer of data from the management entity MDM 130, said smart electricity meter C 120 also checks whether or not the data to be transferred from the management entity MDM 130 are bulky. Said smart electricity meter C 120 therefore checks whether or not the quantity of data to be transferred from the management entity MDM 130 is higher than the predefined first threshold TH1. If such is the case, said smart electricity meter C 120 organises the transfer via the WLAN communication network 103 if said smart electricity meter C 120 has the corresponding connection, and otherwise said smart electricity meter C 120 organises the transfer via the powerline communication network 101. In a variant, said smart electricity meter C 120 knows in advance that such and such a type of transfer is supposed to be organised in order to take place via the WLAN communication network 103 if said smart electricity meter C 120 has the corresponding connection. In this case, the transfer request indicates of which type the transfer in question is (software update, etc.).

Figure 4:
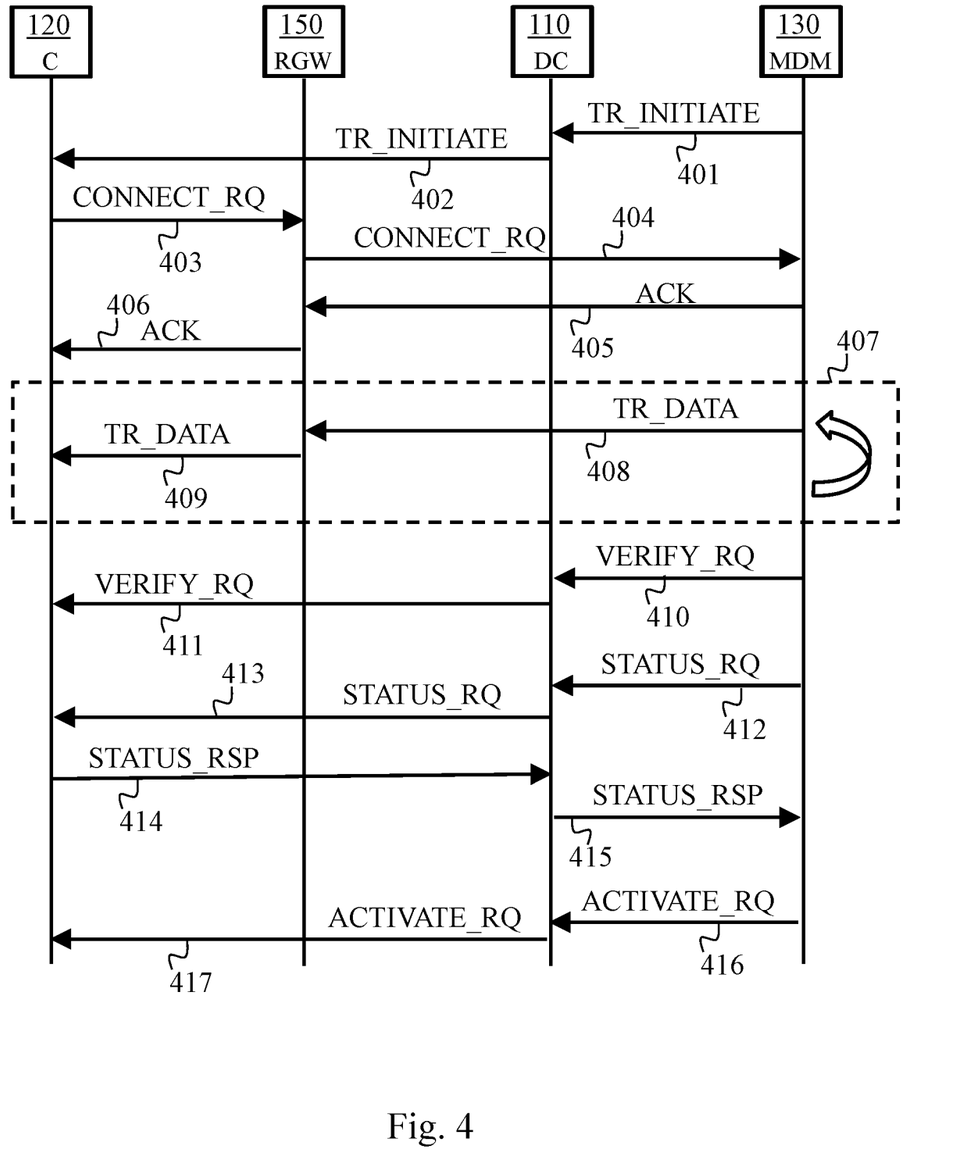
FIG. 4 illustrates schematically an exchange of messages in the context of a transfer of data in the communication system of FIG. 1A, in one embodiment of the present invention.

FIG. 4 illustrates schematically an exchange of messages in the context of a transfer of data in the communication system of FIG. 1A, in one embodiment of the present invention. A smart electricity meter C 120 that has a connection, via a said communication network 103, with a residential gateway RGW 150 enabling it to communicate with the management entity MDM 130 by means thereof is considered therein.

In a step 401, the management entity MDM 130 transmits a message TR_INITIATE that indicates to said smart electricity meter C 120 that a transfer of data, for the attention of said smart electricity meter C 120, is pending with the management entity MDM 130. The management entity MDM 130 transmits the message TR_INITIATE by means of the data concentrator DC 110 to which said smart electricity meter C 120 is attached. This is because the management entity MDM 130 is not informed as to whether or not said smart electricity meter C 120 has an effective connection via a said residential gateway RGW 150. In the case of a software update in a DLMS/COSEM context, the message TR_INITIATE is a message called "image_transfer_initiate".

In a step 402, said data concentrator DC 110 forwards said message TR_INITIATE to said smart electricity meter C 120 via the powerline communication network 101.

In a step 403, following the message TR_INITIATE and after having checked that it actually has a connection with a residential gateway RGW 150, said smart electricity meter C 120 transmits a message CONNECT_RQ to the management entity MDM 130 via the communication network 103.

In a step 404, said residential gateway RGW 150 routes the message CONNECT_RQ to the management entity MDM 130 via the communication network 104. The message CONNECT_RQ indicates a request for connection via the communication network 104 and therefore via said residential gateway RGW 150. Preferentially, the message CONNECT_RQ is a request for establishment of connection in the form of a virtual private network VPN for encrypted transmissions.

In a step 405, the management entity MDM 130 transmits a message ACK that acknowledges and confirms the request for establishment of connection of the message CONNECT_RQ. The management entity MDM 130 transmits the message ACK to said smart electricity meter C 120 via the communication network 104 and therefore via said residential gateway RGW 150.

In a step 406, said residential gateway RGW 150 forwards the message ACK to said smart electricity meter C 120 via the communication network 103.

In a step 407, the transfer of data to which the message TR_INITIATE relates takes place from the management entity MDM 130 to said smart electricity meter C 120. Said smart electricity meter C 120 can recover the data in question from the management entity MDM 130 via said residential gateway RGW 150. In a variant, the management entity MDM 130 can push the data in question to said smart electricity meter C 120 via said residential gateway RGW 150, as shown in FIG. 4. Thus, in a step 408, the management entity MDM 130 transmits some of the data in question in a message TR_DATA and, in a step 409, said residential gateway RGW 150 forwards the message TR_DATA to said smart electricity meter C 120 via the communication network 103. The steps 408 and 409 are repeated until all the data in question are transmitted from the management entity MDM 130 to said smart electricity meter C 120.

For example, a transfer protocol of the FTP (File Transfer Protocol) type can be used for performing the step 407.

At the end of the transfer of data, the management entity MDM 130 and said smart electricity meter C 120 make exchanges of confirmation of successful transfer, via the powerline communication network 101, as detailed hereinafter in a particular embodiment.

In a step 410, the management entity MDM 130 transmits a message VERIFY_RQ that instructs said smart electricity meter C 120 to verify the integrity of the data received. The data (or the message VERIFY_RQ) typically contain a CRC (cyclic redundancy check) checksum or a hashing result to do this. The management entity MDM 130 transmits the message VERIFY_RQ by means of the data concentrator DC 110 to which said smart electricity meter C 120 is attached. In the case of a software update in a DLMS/COSEM context, the message VERIFY_RQ is a message called "image_verify".

In a step 411, the data concentrator DC 110 forwards said message VERIFY_RQ to said smart electricity meter C 120 via the powerline communication network 101. On reception of the message VERIFY_RQ, said smart electricity meter C 120 verifies the integrity of the data received.

In a step 412, the management entity MDM 130 transmits a message STATUS_RQ that requests said smart electricity meter C 120 to indicate in response what the result of the integrity verification is. In the case of a software update in a DLMS/COSEM context, the message STATUS_RQ is a message called "GET (image_transfer_status)".

In a step 413, said data concentrator DC 110 forwards said message STATUS_RQ to said smart electricity meter C 120 via the powerline communication network 101.

In a step 414, said smart electricity meter C 120 transmits a message STATUS_RSP to the management entity MDM 130 via the powerline communication network 101. The message STATUS_RSP includes the result of the integrity verification. In the case of a software update in a DLMS/COSEM context, the message STATUS_RSP is a message called "transfer_status".

In a step 415, said data concentrator DC 110 forwards said message STATUS_RSP to the management entity MDM 130. In the case where the result of the integrity verification shows that data have been corrupted during the transfer, the steps 408 and 409 are repeated for a new transfer. Otherwise, in a step 416, the management entity MDM 130 transmits a message ACTIVATE_RQ that instructs said smart electricity meter C 120 to take into account (i.e. to activate) the data that were transferred to it and the integrity of which was checked successfully. For example, if the data relate to a software update of said smart electricity meter C 120, the message ACTIVATE_RQ instructs said smart electricity meter C 120 to switch onto the updated software. In the case of a software update in a DLMS/COSEM context, the message ACTIVATE_RQ is a message called "image activate".

In a step 417, said data concentrator DC 110 forwards said message ACTIVATE_RQ to said smart electricity meter C 120 via the powerline communication network 101.

Thus the major part of the exchanges in the context of the transfer of bulky data are made via the communication networks 103 and 104, whereas the administration messages of the AMM system are transmitted via the powerline communication network 101, so that said data concentrator DC 110 is informed of the execution of the transfer, as well as potentially the head-end system HES 140, and especially this makes it possible in particular to control, by means of the use of the powerline communication network 101, the switching to the downloaded software in the case of downloading of a software update. This is because the powerline communication network 101 is typically a private communication network whereas the communication network 104 is typically a public communication network, and controlling the switching to the downloaded software is more secure by making the transmissions of the administration messages of the AMM system via the powerline communication network 101.

Figure 5:
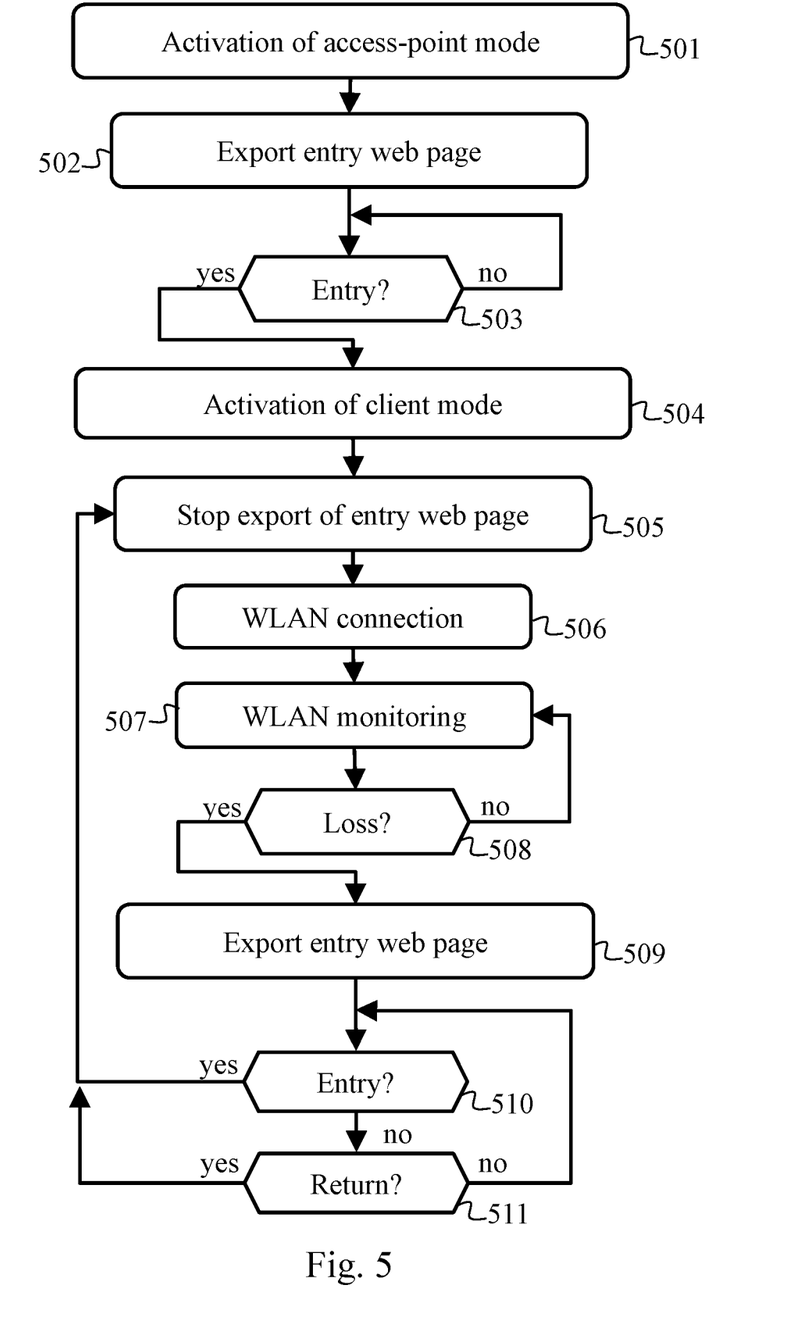
FIG. 5 illustrates schematically an algorithm, executed by at least one smart electricity meter of the system of FIG. 1A, for configuring a communication interface of said smart electricity meter.

FIG. 5 illustrates schematically an algorithm, executed by at least one smart electricity meter C 120, for configuring a communication interface of said smart electricity meter C 120.

In a step 501, the smart electricity meter C 120 activates an access-point AP operating mode on its communication interface 112 adapted to the WLAN networks created and managed by the residential gateways RGW 150. Said smart electricity meter C 120 thus enables wireless terminals to connect thereto.

In a step 502, said smart electricity meter C 120 exports an entry web page by means of a web server. An installer or a user of said smart electricity meter C 120 is then capable of entering a WLAN network name (e.g. SSID (Service Set IDentifier) and an applicable password, by means of a configuration wireless terminal, via this entry web page.

In a step 503, said smart electricity meter C 120 checks whether or not an entry of a WLAN network name and applicable password is made. If such is the case, a step 504 is performed; otherwise the step 503 is repeated.

In the step 504, said smart electricity meter C 120 activates a client operating mode and, in a step 505, stops exporting the entry web page.

In the step 506, said smart electricity meter C 120 makes a connection to the WLAN communication network the name and password of which have been entered.

The name and the password entered are supposed to be the name and the password associated with the communication network 103 created and managed by the residential gateway RGW 150 that said smart electricity meter C 120 can use for contacting the management entity MDM 150. It should also be noted that, if the entry proves to have been incorrect, the step 501 is repeated.

In a step 507, said smart electricity meter C 120 monitors said WLAN communication network in order to ensure that said WLAN communication network remains operational.

In a step 508, said smart electricity meter C 120 checks whether or not there is a loss of connection with said residential gateway RGW, that is to say said smart electricity meter C 120 checks whether or not said WLAN communication network is still present. If there has been a loss of connection, a step 509 is performed; otherwise the step 507 is repeated.

In the step 509, said smart electricity meter C 120 once again exports the entry web page.

In a step 510, said smart electricity meter C 120 checks whether or not an entry of a WLAN network name and applicable password is made. If such is the case, the step 505 is repeated with this WLAN network name and password. This is the case for example when the user replaces his residential gateway RGW 150 with another (e.g. when there is a change of operator providing access to the internet) or the user changes the name and/or the password of the WLAN communication network created and generated by his residential gateway RGW 150. Otherwise a step 511 is performed.

In the step 511, said smart electricity meter C 120 checks whether a return of the WLAN communication network is observed. This is the case for example when the user switches on his residential gateway RGW 150 again after having switched it off. If such is the case, the step 505 is repeated with the WLAN network name and the password that had previously been entered; otherwise the step 510 is repeated.

It should be noted that the access-point AP operating mode and the client operating mode of said smart electricity meter C 120 may be active simultaneously, as depicted in FIG. 5 (as from step 504). In a variant, the access-point AP operating mode and the client operating mode of said smart electricity meter C 120 may be exclusive. In this case, said smart electricity meter C 120 stops the access-point AP operating mode when it activates the client operating mode, and vice versa. More particularly, said smart electricity meter C 120 activates the access-point AP operating mode when the entry web page must be exported in order to obtain the name and the password of the communication network 103 created and generated by said residential gateway RGW 150. It should also be noted that said smart electricity meter C 120 can export the entry web page only when said smart electricity meter C 120 does not have the name and password of the communication network 103 to which said smart electricity meter C 120 can actually connect (network present, password correct). In a variant, said smart electricity meter C 120 can export the entry web page continuously. In yet another variant, said smart electricity meter C 120 can export the entry web page only when the user or the installer presses on a button of said smart electricity meter C 120, and stop exporting the entry web page when the user or the installer presses on said button again or releases said button.

In a particular embodiment, access to the entry web page takes place by entering, in a previous web page, an administration password, known to said smart electricity meter C 120.

The procedure described above in relation to FIG. 5 is particularly useful when the operators controlling said smart electricity meter C 120 and said residential gateway RGW 150 are distinct. When the same operator is controlling said smart electricity meter C 120 and said residential gateway RGW 150, the name and the password expected by said residential gateway RGW 150 can be preconfigured in the smart electricity meter C 120, for example in the factory.

The invention claimed is:

1. A method for transmitting data from a management entity in a communication system comprising at least one data concentrator device to which a smart electricity meter is attached via a first powerline communication network, the smart electricity meter comprising a wireless communication interface adapted to communicate via a third wireless local communication network with a residential gateway connected to the management entity via a fourth communication network, each data concentrator device being connected to the management entity via a second communication network, wherein the first, second, third and fourth communication networks are all networks separate from each other, the method comprising:

in order to transmit data from the management entity to the smart electricity meter, receiving, by the smart electricity meter via the first powerline communication network, a message coming from the management entity and indicating that a data transfer is pending with the management entity;

in response to receiving of the message via the first powerline communication network indicating that the data transfer is pending with the management entity, the smart electricity meter performs:

determining whether the smart electricity meter has a connection and thus a route of transfer for the data, via the third wireless local communication network, with the residential gateway enabling it to communicate with the management entity by means thereof;

when the data can be obtained via either the third wireless local communication network or the first powerline communication network but in response to determining that the data should be downloaded using the third wireless local communication network instead of the first powerline communication network:

obtaining the data from the management entity via the third wireless local communication network with the residential gateway, using the wireless communication interface of the smart electricity meter; and when the smart electricity meter does not have a connection with the third wireless local communication network:
obtaining the data from the management entity via the first powerline communication network.

2. The method according to claim 1, wherein the smart electricity meter also checks whether or not the quantity of data to be transferred from the management entity is higher than a first predefined threshold, such that when the quantity of data to be transferred from the management entity is beyond the first predefined threshold, the transmission of this quantity of data by the first powerline communication network has a probability higher than a probability threshold of undergoing a reconfiguration of the first powerline communication network, and
and wherein the smart electricity meter obtains the data from the management entity via the third wireless local communication network when the smart electricity meter has a connection, via the wireless local communication network, with the residential gateway and furthermore when the quantity of data to be transferred is higher than the first predefined threshold.

3. The method according to claim 1, wherein the smart electricity meter also checks whether or not the quantity of data to be transferred from the management entity is below a value, referred to as the limit value, obtained from a predefined graph and from a probability of success supplied by the management entity representing a probability that the first powerline communication network does not undergo a reconfiguration during the downloading as from the moment when the smart electricity meter begins the downloading, the predefined graph representing quantities of data to be downloaded being associated with values representing probabilities of success of a downloading made via the first powerline communication network, the smart electricity meter obtaining the data from the management entity via the first powerline communication network when the quantity of data to be transferred is below the limit value.

4. The method according to claim 1, wherein the smart electricity meter exports, via the wireless communication interface thereof, an entry web page for making it possible to enter a network name and a password, and the smart electricity meter connects to the residential gateway by means of the network name and the password entered via the entry web page.

5. The method according to claim 4, wherein smart electricity meter exports the entry web page only when the smart electricity meter does not have a network name and a password making it possible to use its wireless communication interface to communicate with the management entity.

6. The method according to claim 1, wherein, after having obtained the data from the management entity via the third wireless local communication network, the smart electricity meter makes, with the management entity, exchanges confirming successful transfer, the exchanges taking place via the first powerline communication network.

7. The method according to claim 1, wherein the wireless communication interface is of Wi-Fi type.

8. A nontransitory storage medium storing a computer program comprising instructions causing execution by a smart electricity meter of the method according to claim 1, when the instructions are read and executed by a processor of the smart electricity meter.

9. A smart electricity meter configured to receive data from a management entity in a communication system comprising at least one data concentrator device to which at least the smart electricity meter is attached via a first powerline communication network, each data concentrator device being connected to the management entity via a second communication network, the smart electricity meter comprising:
electronics circuitry configured to, in order to transmit data from the management entity to the smart electricity meter, receive, coming from the management entity, via the first powerline communication network, a message indicating that a data transfer is pending with the management entity; and
a wireless communication interface configured to:
communicate, via a third wireless local communication network, with a residential gateway connected to the management entity via a fourth communication network, and
on reception of the message indicating that the data transfer is pending with the management entity, the smart electricity meter is configured to:
determine whether the smart electricity meter has a connection and thus a route of transfer for the data, via the third wireless local communication network, with the residential gateway enabling it to communicate with the management entity by means thereof;
when the data can be obtained via either the third wireless local communication network or the first powerline communication network but in response to determining that the data should be downloaded using the third wireless local communication network instead of the first powerline communication network:
obtain the data from the management entity via the third wireless local communication network when the smart electricity meter has a connection, via the third wireless local communication network, with the residential gateway; and
obtain the data from the management entity via the first powerline communication network when the smart electricity meter does not have a connection with the third wireless local communication network.

* * * * *